United States Patent [19]
Odashima et al.

[11] Patent Number: 5,998,243
[45] Date of Patent: Dec. 7, 1999

[54] METHOD FOR MANUFACTURING SEMICONDUCTOR DEVICE AND APPARATUS FOR RESIN-ENCAPSULATING

[75] Inventors: Teikou Odashima, Yokohama; Mikio Matsui, Kawasaki; Yoshiaki Sugizaki, Fujisawa; Takahito Nakazawa, Yokohama, all of Japan

[73] Assignee: Kabushiki Kaisha Toshiba, Japan

[21] Appl. No.: 09/172,040

[22] Filed: Oct. 14, 1998

[30] Foreign Application Priority Data

Oct. 15, 1997 [JP] Japan ................................ 9-299403

[51] Int. Cl.[6] ........................................ H01L 21/44
[52] U.S. Cl. ........................ 438/127; 438/124; 438/126
[58] Field of Search ..................................... 438/118, 124, 438/125, 126, 127

[56] References Cited

U.S. PATENT DOCUMENTS

| | | | |
|---|---|---|---|
| 5,077,237 | 12/1991 | Hara | 438/124 |
| 5,304,512 | 4/1994 | Arai et al. | 438/124 |
| 5,447,888 | 9/1995 | Takashima et al. | 438/124 |
| 5,482,896 | 1/1996 | Tang | 438/118 |
| 5,668,059 | 9/1997 | Christie et al. | 438/118 |
| 5,672,550 | 9/1997 | Tsuji et al. | 638/124 |
| 5,710,062 | 1/1998 | Sawai et al. | 438/127 |
| 5,753,538 | 5/1998 | Kuno et al. | 438/127 |
| 5,817,545 | 10/1998 | Wang et al. | 438/127 |
| 5,874,324 | 2/1999 | Osada | 438/124 |

FOREIGN PATENT DOCUMENTS 10-64932  3/1998  Japan .
10-64936  3/1998  Japan .

*Primary Examiner*—Kevin M. Picardat
*Attorney, Agent, or Firm*—Finnegan, Henderson, Farabow, Garrett & Dunner, L.L.P.

[57] ABSTRACT

In a method for manufacturing a flip-chip bonded semiconductor device is used an apparatus for resin-encapsulating, the apparatus which comprises a molding die consisting of a plurality of mold bodies, device for decompressing cavities of the molding die, device for heating the molding die, and device for injecting a liquid resin under pressure into the cavities, to form a resin-encapsulating layer by transfer molding. A bonded body having a semiconductor chip connected to a wiring substrate through its bumps is placed in the cavities of the molding die, the cavities are heated and decompressed, then the liquid resin is injected under pressure into the cavities through a gate to form a resin-encapsulating layer. Thus, the molding resin can be filled uniformly into the gap between the semiconductor chip and the wiring substrate in a short time to produce a flip-chip bonded semiconductor device having good performances.

2 Claims, 12 Drawing Sheets

METHOD FOR MANUFACTURING SEMICONDUCTOR DEVICE AND APPARATUS FOR RESIN-ENCAPSULATING

BACKGROUND OF THE INVENTION

1. Field of the Invention

The present invention relates to a method for manufacturing a semiconductor device, and more particularly to a method for manufacturing a semiconductor device by encapsulating a bonded body, which has a semiconductor element (e.g., a semiconductor chip) flip-chip bonded to a wiring substrate, with a molding resin.

The invention also relates to an apparatus for resin-encapsulating to seal the flip-chip bonded body with a molding resin.

2. Description of the Related Art

Flip-chip bonding is a method for connecting ball-shaped protruded electrodes (hereinafter called bumps), which are formed as external connecting terminals on electrode pads of a semiconductor chip, to connecting terminals of a wiring substrate.

Figure 16:
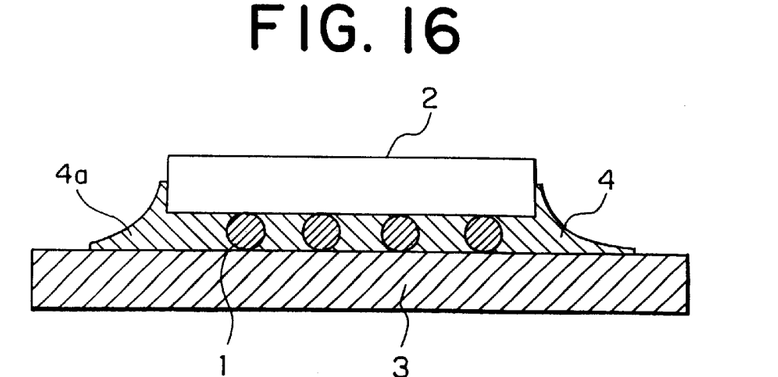
FIG. 16 is a sectional diagram of a conventional flip-chip bonded semiconductor device.

FIG. 16 shows a structure of the semiconductor device (hereinafter called a flip-chip bonded semiconductor device) which has a semiconductor chip such as a silicon semiconductor connected to the wiring substrate by the flip-chip bonding.

In a conventional flip-chip bonded semiconductor device, a semiconductor chip 2 having bumps 1 such as solder balls is mounted on one main face of a wiring substrate 3 and electrically connected thereto through the bumps 1. External connecting terminals (not shown) are formed on the other main face of the wiring substrate 3 and electrically connected to the bumps of the semiconductor chip 2 through internal wiring (not shown) formed within the wiring substrate. A signal from or to an integrated circuit formed on the semiconductor chip 2 is input or output through the external connecting terminals of the wiring substrate 3. In the gap between the wiring substrate 3 and the semiconductor chip 2, where the bumps 1 are formed, a resin-encapsulating layer 4 made of epoxy resin or the like is disposed to protect the connection of the semiconductor chip 2 with the wiring substrate 3.

This resin-encapsulating layer 4 is conventionally formed by the following method.

Figure 17A:
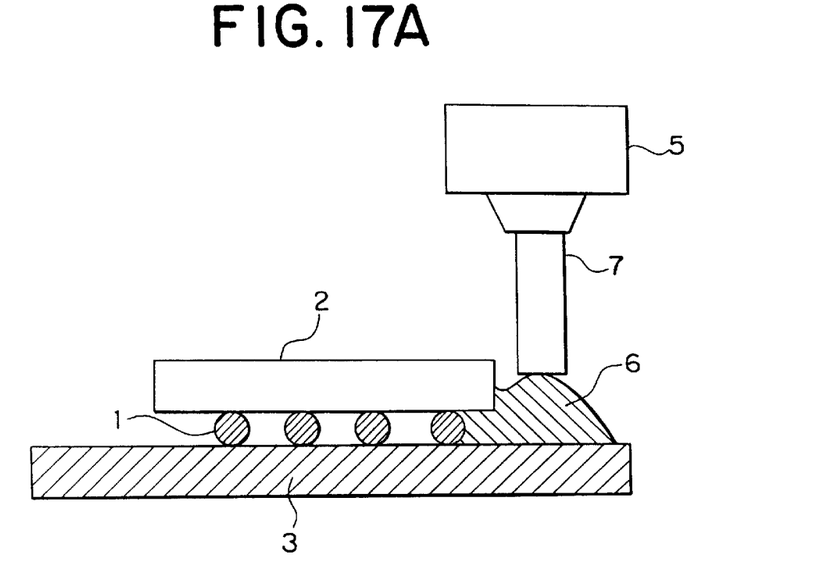
FIG. 17A, FIG. 17B, and FIG. 17C are sectional diagrams of a resin-encapsulating layer for illustrating a conventional method for forming a resin-encapsulating layer.
Figure 17B:
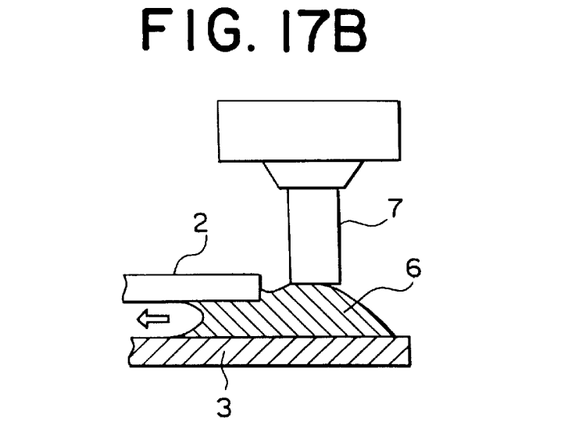
Figure 17C:
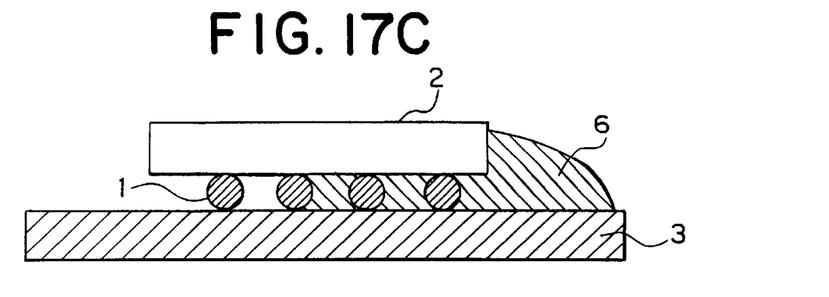

As shown in FIG. 17A, a liquid resin (e.g., epoxy resin) 6 thermally softened and stocked in a syringe 5 is dispensed in the neighborhood of the sides of the semiconductor chip 2 mounted on the wiring substrate 3 through a dispense nozzle 7. The dispensed liquid resin 6 permeates into the gap between the wiring substrate 3 and the semiconductor chip 2 by a capillary action as shown in FIG. 17B. As shown in FIG. 17C, the liquid resin 6 is fully filled into the space among the bumps 1 and cured to form underfill.

Such a method for forming the resin-encapsulating layer, however, has a disadvantage that it takes time to form the underfill by filling the liquid resin 6 into the gap between the wiring substrate 3 and the semiconductor chip 2.

To form fillet 4a (as shown in FIG. 16) after filling the resin into the gap, the liquid resin 6 is dispensed again to apply in the neighborhood of the sides of the semiconductor chip 2, where the liquid resin 6 was not applied in the first dispensing step. This method, however, has disadvantages that time for forming the resin-encapsulating layer 4 is a total of time required for applying the liquid resin 6 by dispensing and that required for filling the molding resin into the gap between the semiconductor chip and the wiring substrate 3 by permeating the molding resin through the sides of the semiconductor chip 2, resulting in taking a long time and lowering productivity.

In manufacturing a semiconductor device by mounting a semiconductor chip on a lead-frame and wire-bonding the electrode pads of the semiconductor chip to the leads of the lead-frame, the resin-encapsulating layer is formed by transfer molding.

But, if such a method for forming the resin-encapsulating layer were directly adopted in order to manufacture the flip-chip bonded semiconductor device, it has a disadvantage of defectively filling the molding resin because the gap between the semiconductor chip and the wiring substrate is very small to about 0.2 mm. If the molding resin had a low viscosity, it has a disadvantage of spreading around (flowing to the periphery) to adhere to undesired portions, causing defective appearance. Besides, such disadvantages are becoming serious because the gap between the semiconductor chip and the wiring substrate has a tendency to become smaller to 0.01 to 0.1 mm.

SUMMARY OF THE INVENTION

The invention was achieved to remedy the disadvantages described above. Specifically, it is an object of the invention to provide a method for manufacturing a flip-chip bonded semiconductor device having a resin-encapsulating layer with good characteristics by uniformly filling a liquid resin into the gap between a semiconductor chip and a wiring substrate in a short time.

It is another object of the invention to provide an apparatus for resin-encapsulating, which can readily form a resin-encapsulating layer with good characteristics by uniformly filling a liquid resin into the gap between a semiconductor chip and a wiring substrate in a short time in manufacturing a flip-chip bonded semiconductor device.

A method for manufacturing a semiconductor device according to the invention comprises a step for setting a flip-chip bonded body, which has at least one semiconductor element electrically connected to a wiring substrate through bumps, in a cavity of a molding die formed of a plurality of mold bodies; and a step for injecting a molding resin under pressure by transfer molding into the cavity of the molding die having the flip-chip bonded body therein to form a resin-encapsulating layer between the semiconductor element and the wiring substrate.

The method for manufacturing a semiconductor device further comprises a step for heating the molding die before injecting the molding resin under pressure into the cavity of the molding die, and a step for decompressing the cavity of the molding die heated in the heating step.

The molding resin injected under pressure into the cavity of the molding die may be a liquid resin.

An apparatus for resin-encapsulating according to the invention comprises a molding die, which comprises a plurality of mold bodies and has a cavity for accommodating a flip-chip bonded body, which has at least one semiconductor element electrically connected to a wiring substrate through bumps, and a resin injection gate into the cavity; means for decompressing the cavity of the molding die; means for heating the molding die; and means for injecting the liquid resin under pressure into the cavity.

In the apparatus for resin-encapsulating, the means for injecting the liquid resin under pressure into the cavity can be means for injecting the liquid resin under pressure by a plunger or rotations of a screw.

The apparatus for resin-encapsulating may have the resin injection gate disposed in more than one around the cavity. There may be a case that the cavity has a rectangular flat shape, and the resin injection gate is formed along the total length of one or more than two slides of the cavity.

In the apparatus for resin-encapsulating, the means for decompressing the cavity is means for exhausting it. And, the exhausting means has an exhaust passage open to the cavity and an valve for adjusting to open and close the exhaust passage. The exhaust valve opens the exhaust passage in a step of exhausting the cavity to decompress it and closes the exhaust passage in a step of injecting the liquid resin under pressure into the cavity.

In the apparatus for resin-encapsulating, a rubber-like elastic body is disposed in a region of the molding die, which comes in contact with the wiring substrate of the flip-chip bonded body.

In the apparatus for resin-encapsulating, a holder and an elastic body are disposed on the outer surface of the molding die to hold the molding die by the holder through the elastic body. The elastic body has a modulus of elasticity of 250 to 2,100,000 Kgf/cm$^2$.

Compared with a conventional method for dispensing the liquid resin to apply it, the method for manufacturing a semiconductor device according to the invention can uniformly fill the liquid resin into the gap between the semiconductor chip and the wiring substrate in a short time and form the uniform resin-encapsulating layer with good characteristics in a short time.

According to the apparatus for resin-encapsulating according to the invention, the resin-encapsulating layer can be formed readily in a short time. Where the molding die has a plurality of cavities, a layer of an elastic body can be formed on the exterior of the molding die to correct non-uniformity (variations) such as inclination of the wiring substrate and to make uniform contact of the molding die. Further, a layer of a rubber-like elastic body can be disposed in a region of the molding die, which comes in contact with the wiring board, to prevent the molding resin from leaking to undesired portions of the wiring board.

BRIEF DESCRIPTION OF THE DRAWINGS

FIG. 13A, FIG. 13B, FIG. 13C, FIG. 13D, FIG. 13E, FIG. 13F, FIG. 13G, FIG. 13H, FIG. 13I, FIG. 13J, FIG. 13K, FIG. 13L, FIG. 13M, FIG. 13N, FIG. 13O, FIG. 13P, and FIG. 13Q are plan diagrams showing the positional relations between a cavity and an exhaust vent of a metal mold in the respective embodiments of the invention;

DETAILED DESCRIPTION OF THE PREFERRED EMBODIMENTS

Preferred embodiments of the invention will be described below with reference to the accompanying drawings.

Embodiment 1

Referring to FIG. 1 and FIGS. 2A to 2C, an apparatus for resin-encapsulating and a method for manufacturing a semiconductor device according to a first embodiment will be described respectively.

Figure 1:
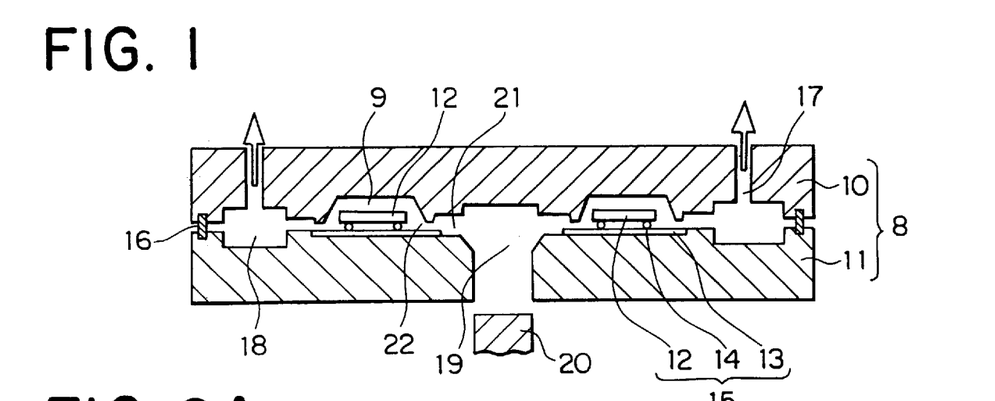
FIG. 1 is a sectional diagram showing main parts of the apparatus for resin-encapsulating according to a first embodiment of the invention.

As shown in FIG. 1, the apparatus for resin-encapsulating of the first embodiment has a resin-encapsulating metal mold 8, means for reducing the interiors of cavities 9 of the metal mold 8 by exhausting, means for heating the metal mold 8, and means for injecting a liquid resin under pressure into the cavities 9 of the metal mold 8.

The metal mold 8 has an upper mold 10 as a first molding block and a lower mold 11 as a second molding block. The upper mold 10 and the lower mold 11 are disposed to oppose each other and clamped to form the plurality of cavities 9 for accommodating an object to be encapsulated. In this embodiment, as the object to be encapsulated, a flip-chip bonded body 15, which has a semiconductor chip 12 connected to a wiring substrate 13 through bumps 14, is accommodated in each of the plurality of cavities 9.

A pressure-reducing seal 16 made of fluorine-contained rubber or the like is disposed along the peripheral edges of the contact faces of the upper mold 10 and the lower mold 11. In order to produce a high vacuum in the cavities 9 in a short time, the pressure-reducing seal 16 is preferably formed to provide a high vacuum even when a gap of about 1 mm is maintained between the upper mold 10 and the lower mold 11 for several seconds immediately before completely clamping.

Exhaust vents 17 are formed on the upper mold 10. Each exhaust vent 17 is formed close to a part of the cavity 9, e.g., a corner thereof, and has at its bottom a non-contact area 18 having a depth sufficient so to prevent a pertinent face of the upper mold 10 from contacting to the wiring substrate 13 of the flip-chip bonded body 15 when clamping the molding die. The lower mold 11 has a pot 19, which stores a liquid resin such as a thermosetting epoxy resin. The pot 19 has a plunger 20 to reciprocate (up and down) freely therein. A resin passage comprising a runner 21 and a gate 22 is formed from the pot 19 to each cavity 9. The gate 22 through which the molding resin is injected into the cavity 9 can be formed in any size at any position to uniformly inject the liquid resin into all parts of the cavity 9. In order to prevent the molding resin from remaining on the wiring substrate 13 after forming, the gate 22 may be formed at the top of the cavity 9 and close to the top face of the flip-chip bonded body 15.

The pot 19 has a space having at least a volume equivalent to an appropriate amount of the molding resin. Since the liquid resin used has a low viscosity, it may leak through a gap between the pot 19 and the plunger 20. In order to prevent the molding resin from leaking, a seal ring (not shown) made of fluorine plastics or the like can be put on the outer wall of the plunger 20 to decrease the gap between the inner wall of the pot 19 and the outer wall of the plunger 20 as small as possible. The seal ring is preferably configured so that it can be exchanged quickly when it is worn away.

The apparatus for resin-encapsulating of the first embodiment has a vacuum pump (not shown) as means for exhausting the cavities 9 of the metal mold 8 to reduce the pressure connected with the exhaust vent 17. A heating plate (not shown) is disposed under the metal mold 8 as means to heat it. As means for heating the metal mold 8, an electric heater can be built in the upper mold 10 and the lower mold 11. A syringe (not shown) for stocking the liquid resin is also connected to the pot 19 of the metal mold 8, as means for injecting the liquid resin under pressure. The liquid resin in the syringe is applied in an appropriate amount into the pot 19 by air pressure.

Now, the first embodiment is described to make resin-encapsulating by the apparatus for resin-encapsulating.

Figure 2A:
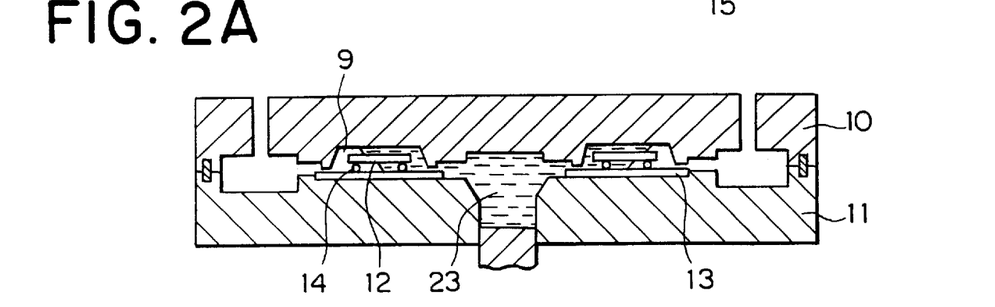
FIG. 2A, FIG. 2B, and FIG. 2C are sectional diagrams showing main parts of the apparatus for resin-encapsulating in respective steps in order to illustrate a method for manufacturing the semiconductor device according to the first embodiment of the invention.
Figure 2B:
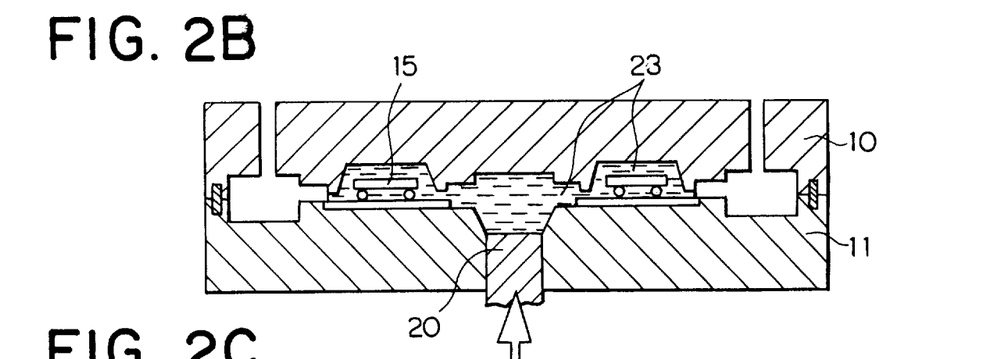
Figure 2C:
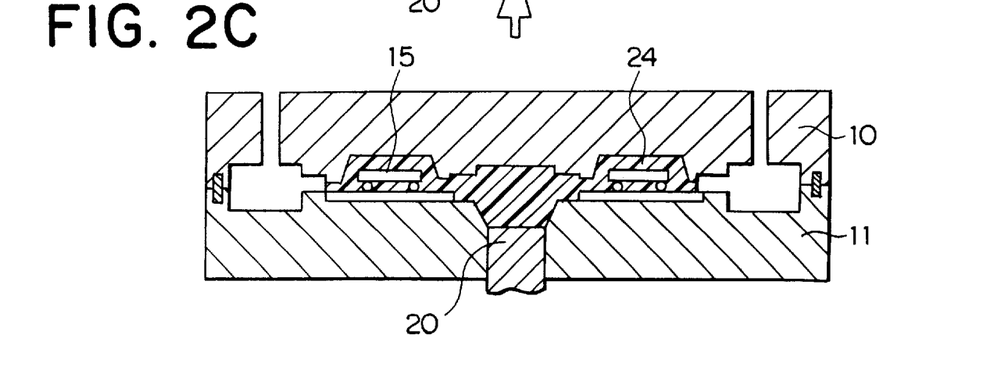

First, the flip-chip bonded body 15 having the semiconductor chip 12 connected to the wiring substrate 13 through the bumps 14 is set in position in the lower mold 11 of the metal mold 8. The liquid resin stocked in the syringe is supplied in an appropriate amount into the pot 19 of the metal mold 8 through a dispense nozzle by air pressure. Then, the cavities 9 are exhausted through the exhaust vent 17 by the vacuum pump so to have a reduced pressure before completely clamping the molding die. While maintaining the cavities 9 under high vacuum of 10 Torr or below, the upper and lower molds 10, 11 are clamped. As shown in FIG. 2A, a liquid resin 23 stored in the pot 19 is extruded by the plunger 20 and injected under pressure into the cavities 9 from the gate 22 through the runner 21. A pressure in a range of 1 to 20 MPa is continuously applied to the liquid resin 23 by the plunger 20 until voids are removed from the liquid resin 23 charged into the cavities 9 as shown in FIG. 2B. The application of pressure is stopped after confirming that the molding resin is also filled uniformly into the gap between the wiring substrate 13 and the semiconductor chip 12 of the flip-chip bonded body 15. As shown in FIG. 2C, the molding resin filled into the cavities 9 is cured and hardened, then an excess portion of the molding resin adhered to a resin-encapsulating layer 24 is removed.

Thus, the liquid resin 23 is uniformly filled among the bumps 14 between the wiring substrate 13 and the semiconductor chip 12 in a short time to produce the flip-chip bonded semiconductor devices 15 having the resin-encapsulating layer 24 which is uniform and has good characteristics. Specifically, the first embodiment can simultaneously form the resin-encapsulating layers 24 for a plurality of semiconductor devices in about 30 seconds, while the conventional method requires about one minute to form the underfill after dispensing the liquid resin to apply to the wiring substrate.

The flip-chip bonded body as the object to be encapsulated of the invention and the flip-chip bonded semiconductor device manufactured by the invention will be described in detail with reference to FIG. 3 through FIG. 5.

Figure 3:
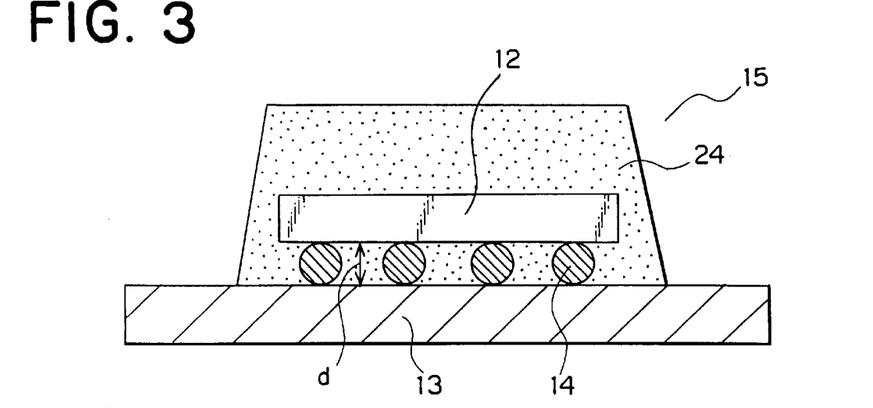
FIG. 3 is a sectional diagram showing an over-coat type flip-chip bonded semiconductor device manufactured according to the first embodiment of the invention.

FIG. 3 shows the semiconductor device having a configuration that the semiconductor chip 12 is fully buried under the resin-encapsulating layer 24. This overcoat type semiconductor device is manufactured in the first embodiment described above.

Figure 4A:
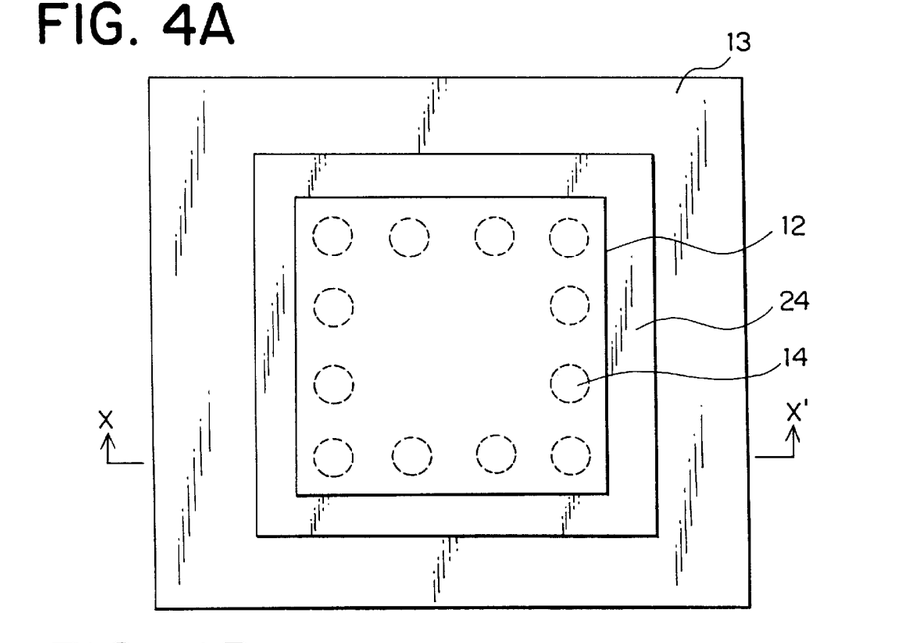
FIG. 4A and FIG. 4B are a plan diagram of a top-revealed type flip-chip bonded semiconductor device manufactured according to third to sixth embodiments of the invention and a sectional diagram taken along line X-X' of FIG. 4A.
Figure 4B:
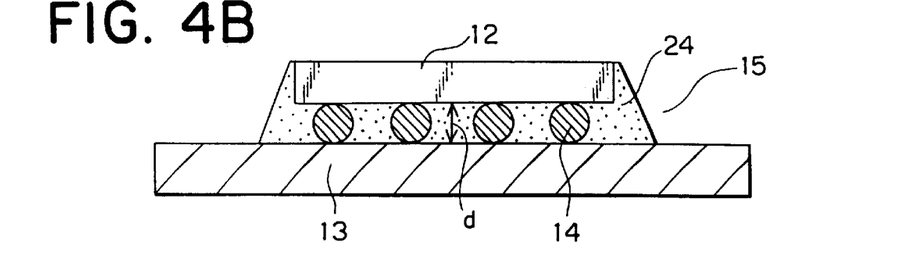
Figure 5:
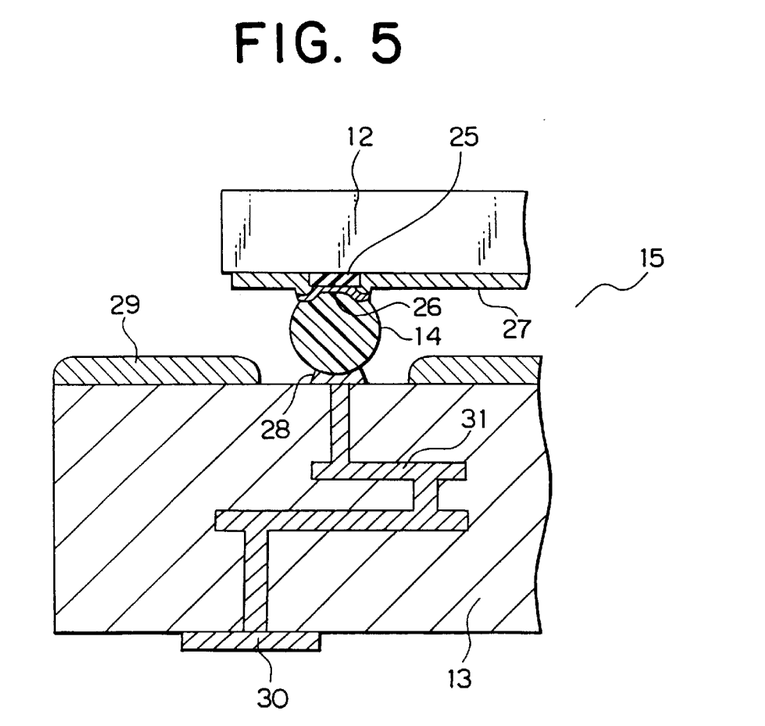
FIG. 5 is an enlarged sectional diagram showing the configuration of a connected portion between a semiconductor chip and a wiring substrate in a flip-chip bonded body.

FIG. 4A and FIG. 4B show a semiconductor device configured to reveal the top face of the semiconductor chip 12 by not being covered with the resin-encapsulating layer 24. Third to sixth embodiments to be described afterward manufacture such a semiconductor device with its top face exposed.

Such a flip-chip bonded semiconductor device has wiring (not shown) formed on one main face of the wiring substrate 13 and the bumps 14 as connecting pads of the semiconductor chip 12 electrically connected to the wiring. The semiconductor chip 12 and the bumps 14 are coated with the resin-encapsulating layer 24 made of epoxy resin or the like, and a part of the wiring substrate 13 on which the chip is mounted is also coated with the resin-encapsulating layer 24.

The connected portion of the semiconductor chip 12 with the wiring substrate 13 of the flip-chip bonded body 15 will be described in detail with reference to FIG. 5.

In the flip-chip bonded body 15, electrode pads 25 of aluminum or the like are formed on the main face of the semiconductor chip 12. A plating layer 26 of copper or the like is formed on the surface of the individual electrode pad 25 and ball bumps 14 of Pb—Sn solder are formed on the plating layer 26. The other region of the main face of the semiconductor chip 12, where the electrode pads 25 are not formed, is coated for protection with a passivation film 27 such as an oxide film. Meanwhile, wiring (connecting pad) 28 is formed on the other main face of the wiring substrate 13, and the remaining region of the same face, where the wiring 28 is not formed, is coated with a solder resist film 29. Connecting electrodes 30 are formed on the other main face (back face) of the wiring substrate 13 and electrically connected to the wiring (connecting pad) 28 on the main face through inner wiring 31 of copper or the like formed as via holes in the wiring substrate 13. Bumps of solder or the like may be mounted on the connecting electrodes 30 of the wiring substrate 13. The bumps 14 of the semiconductor chip 12 are connected to the wiring 28 of the wiring substrate 13. A signal coming from or to an integrated circuit formed on the semiconductor chip 12 is input to or output from an external circuit through the connecting electrodes 30 of the wiring substrate 13.

According to the first embodiment described above, the molding resin is uniformly filled among the bumps 14 to uniformly form the resin-encapsulating layer 24 even if the gap d between the wiring substrate 13 and the semiconductor chip 12 is 0.2 mm or below. Even with further miniaturization of the semiconductor device to reduce the gap d between the wiring substrate 13 and the semiconductor chip 12 to 0.01 to 0.1 mm, the resin-encapsulating layer 24 can still be formed uniformly.

Embodiment 2

Referring to FIG. 6 and FIGS. 7A to 7C, the apparatus for resin-encapsulating and the method for manufacturing a semiconductor device according to a second embodiment will be described.

Figure 6:
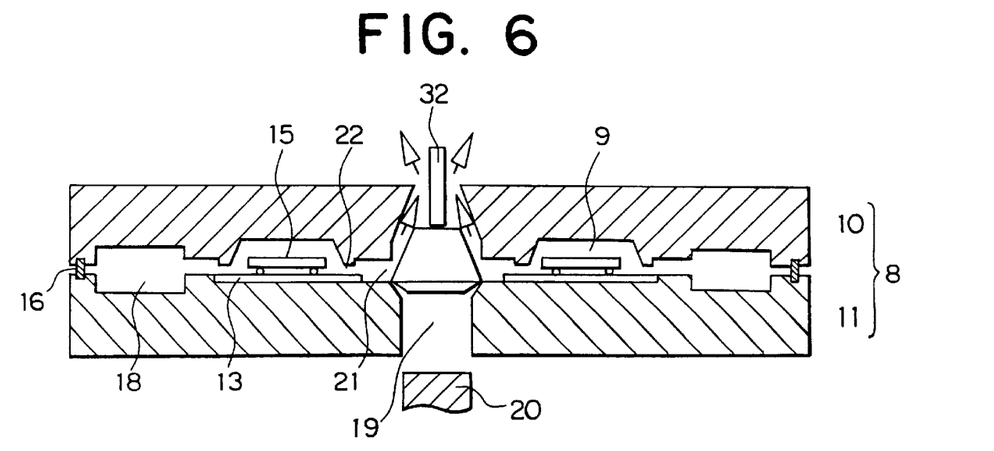
FIG. 6 is a sectional diagram showing main parts of the apparatus for resin-encapsulating according to a second embodiment of the invention.

As shown in FIG. 6, the apparatus for resin-encapsulating according to the second embodiment has the metal mold 8, means for exhausting the cavities 9 of the metal mold 8 to a decompressed state, means for heating the metal mold 8, and means for injecting the liquid resin under pressure into the cavities 9 of the metal mold 8.

The metal mold 8 has the upper mold 10 and the lower mold 11 which are opposed to each other. A plurality of cavities 9 is formed by these mold blocks to accommodate the flip-chip bonded body 15 as the object to be encapsulated.

A pressure-reducing seal 16 made of fluorine-contained rubber or the like is disposed along the peripheral edges of the contact faces of the upper mold 10 and the lower mold 11.

The exhaust vent 17 is formed on the upper mold 10 at the middle of the plurality of cavities 9 and also close to them. An exhaust valve 32 is disposed in the exhaust vent 17. In the neighborhood of the cavities of the lower mold 11, the non-contact area 18 is formed to have a depth sufficient to prevent the pertinent face of the upper mold 10 from coming in contact with the wiring substrate 13 of the flip-chip bonded body 15 when clamping the molding die. The lower mold 11 also has the pot 19 which stores a liquid resin such as an epoxy resin. The pot 19 has the plunger 20 to reciprocate freely therein. The resin passage comprising the runner 21 and the gate 22 is formed from the pot 19 to each cavity 9.

The apparatus for resin-encapsulating according to the second embodiment has a vacuum pump (not shown) as means for decompressing the cavities 9 of the metal mold 8 connected to the exhaust vent 17. And, a heating plate (not shown) is disposed under the metal mold 8 as means for heating it. A syringe (not shown) containing the liquid resin is connected as means for injecting the liquid resin under pressure into the pot 19 of the metal mold 8. The liquid resin in the syringe is supplied in an appropriate amount to the pot 19 by air pressure.

The second embodiment to form the resin-encapsulating layer by the apparatus for resin-encapsulating will be described.

Figure 7A:
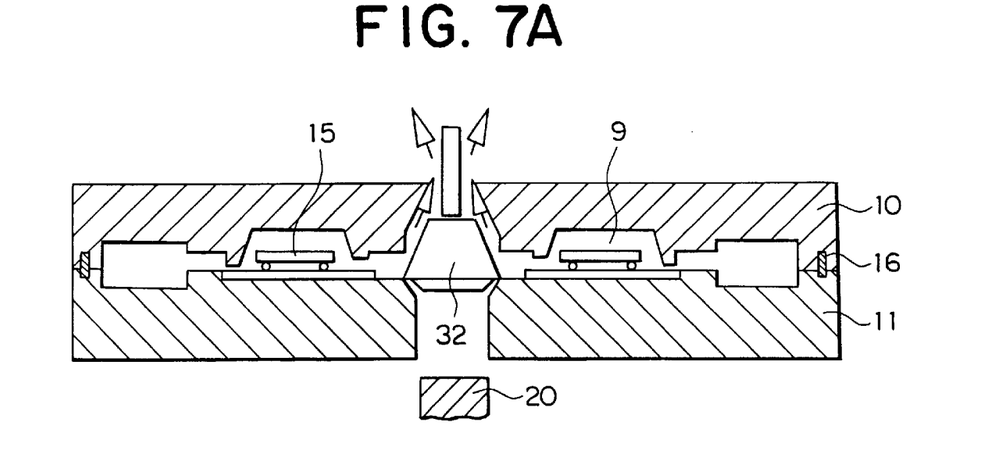
FIG. 7A, FIG. 7B, and FIG. 7C are sectional diagrams showing main parts of the apparatus for resin-encapsulating in respective steps for illustrating the method for manufacturing the semiconductor device according to the second embodiment of the invention.
Figure 7B:
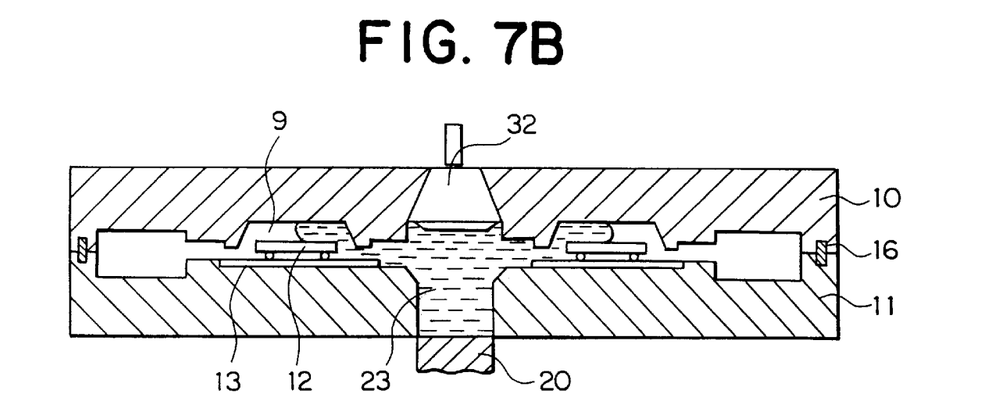
Figure 7C:
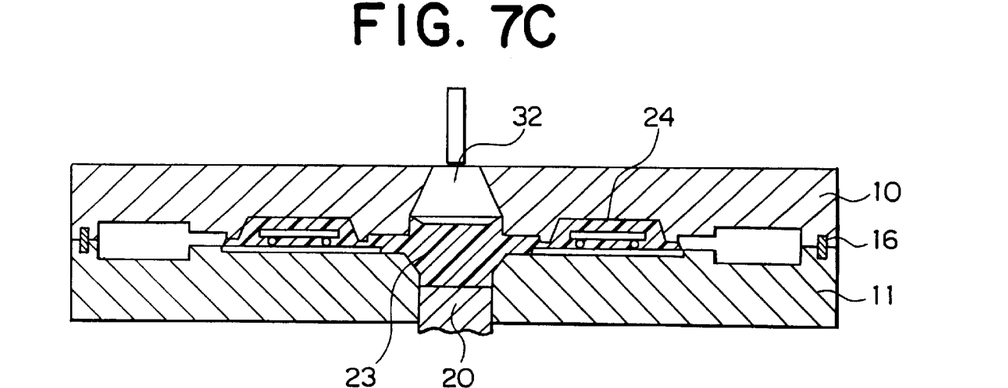

As shown in FIG. 6, the flip-chip bonded body 15 having the semiconductor chip 12 connected to the wiring substrate 13 through the bumps 14 is set in position in the lower mold 11 of the metal mold 8, and the liquid resin stocked in the syringe is supplied in an appropriate amount into the pot 19 through a dispense nozzle. Then, before the upper mold 10 and the lower mold 11 are clamped completely, the cavities are exhausted and decompressed by a vacuum pump with the exhaust valve 32 pushed down and the exhaust vent 17 open to keep the molding die under high vacuum of 10 Torr or below. Then, the molding die is completely clamped as shown in FIG. 7A. The exhaust valve 32 closes the resin passage between the pot 19 and the runner 21. As shown in FIG. 7B, the liquid resin 23 stored in the pot 19 is extruded from the pot 19 by the plunger 20. The liquid resin 23 pushed by the plunger 20 pushes up the exhaust valve 32 to open the resin passage, and the exhaust vent 17 is closed by the exhaust valve 32 pushed up. The liquid resin 23 is injected under pressure into the cavities 9 from the gate 22 through the runner 21. As shown in FIG. 7C, a pressure in a range of 1 to 20 MPa is continuously applied to the liquid resin 23 by the plunger 20 until voids are removed from the liquid resin 23 charged into the cavities 9. The application of pressure is stopped after confirming that the molding resin is also filled uniformly into the gap between the wiring substrate 13 and the semiconductor chip 12 of the flip-chip bonded body 15. The molding resin filled into the cavities 9 is cured and hardened, then an excess portion of the molding resin adhered to the resin-encapsulating layer 24 is removed.

Thus, the liquid resin 23 is uniformly filled among the bumps 14 between the wiring substrate 13 and the semiconductor chip 12 in a short time to produce uniformly the resin-encapsulating layer 24 with good characteristics. As shown in FIG. 3, an overcoat type flip-chip bonded semiconductor device which has the semiconductor chip 12 completely coated above its top with the resin-encapsulating layer 24 is obtained.

Embodiment 3

A third embodiment will be described with reference to FIG. 8.

Figure 8:
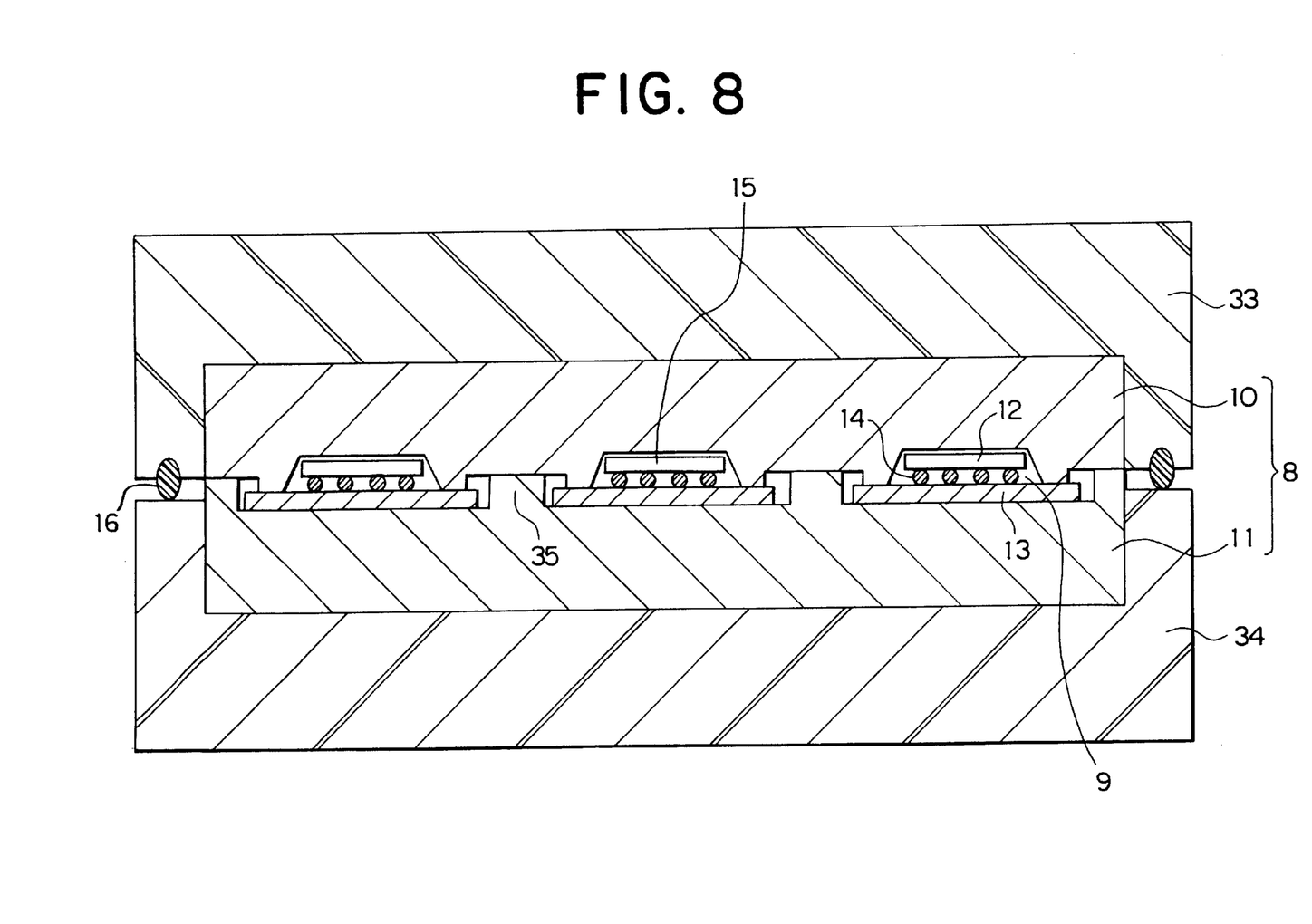
FIG. 8 is a sectional diagram showing main parts of the apparatus for resin-encapsulating according to the third embodiment of the invention.

FIG. 8 is a sectional diagram showing main parts of the apparatus for resin-encapsulating according to the third embodiment. This embodiment is configured to have the same structures as in the first embodiment to exhaust the cavities to decompress through the exhaust vent and to inject the liquid resin under pressure into the cavities through the resin passage from the gate. Therefore, the same structures are not shown as a drawing.

The metal mold 8 has the upper mold 10 and the lower mold 11 disposed to oppose each other. These mold blocks form a plurality of cavities 9 for accommodating the flip-chip bonded body 15 as the object to be encapsulated. The upper mold 10 is held by a first holder 33, and the lower mold 11 is held by a second holder 34. The first holder 33 and the second holder 34 each may hold a plurality of mold blocks collectively.

The pressure-reducing seal 16 made of fluorine-contained rubber or the like is disposed along the peripheral edges of the contact faces of the first holder 33 and the second holder 34. A projection 35 is formed at the midway between the cavities 9 of the lower mold 11. The projection 35 is in contact with the opposed face of the upper mold 10 to receive the load from above when the molding die is clamped, thereby preventing an excessive load from being applied to the wiring substrate 13 of the flip-chip bonded body 15 accommodated in the cavities 9. A depth of each cavity 9 is adjusted by a height of the projection 35, which also serves as a stopper. Thus, it is suitable for forming the resin-encapsulating layer 24 of a thin semiconductor device which is of a top-exposed type.

In the third embodiment, the flip-chip bonded body 15 is set in the lower mold 11 of the metal mold 8. The liquid resin stocked in the syringe is supplied in an appropriate amount into the pot through a dispense nozzle. Before clamping the upper mold 10 and the lower mold 11, the cavities 9 are exhausted and decompressed through the exhaust vent by a vacuum pump and held under high vacuum of 10 Torr or below. The liquid resin stored in the pot is extruded from the pot by the plunger and injected under pressure into the cavities 9 from the gate through the runner. A pressure in a range of 1 to 20 MPa is continuously applied to the liquid resin by the plunger until voids are removed from the liquid resin charged into the cavities 9. The application of pressure is stopped after confirming that the molding resin is also filled uniformly into the gap between the wiring substrate 13 and the semiconductor chip 12 of the flip-chip bonded body 15. The molding resin filled into the cavities 9 is cured and hardened, then an excess portion of the molding resin adhered to a resin-encapsulating layer is removed.

Thus, the liquid resin is uniformly filled among the bumps 14 between the wiring substrate 13 and the semiconductor chip 12 in a short time to produce the uniform resin-encapsulating layer with good characteristics. As shown in FIGS. 4A and 4B, a thin flip-chip bonded semiconductor device, which has the top of the semiconductor chip 12 not coated with the resin-encapsulating layer 24, can be manufactured in a short time.

Embodiment 4

A fourth embodiment will be described with reference to FIG. 9.

Figure 9:
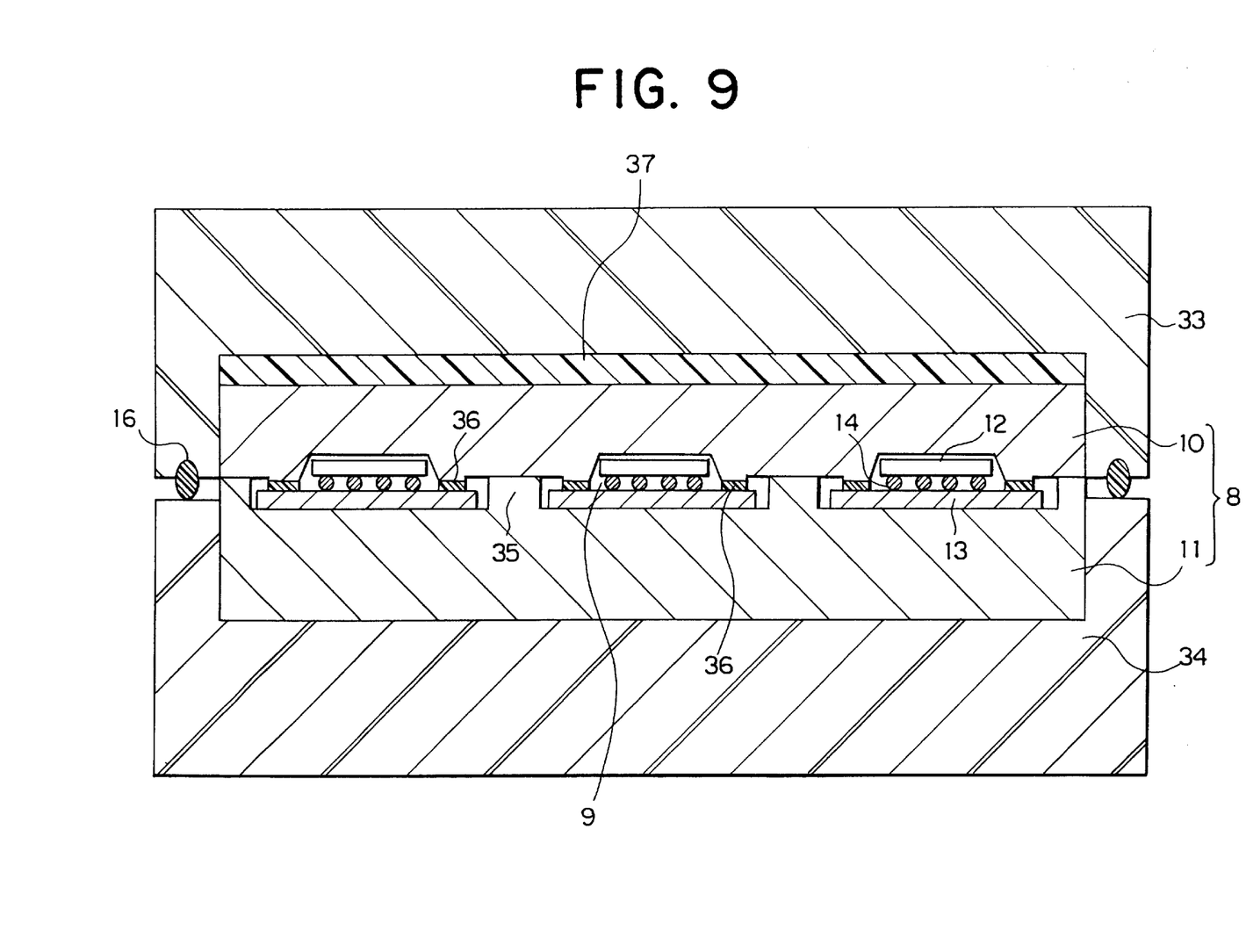
FIG. 9 is a sectional diagram showing main parts of the apparatus for resin-encapsulating according to the fourth embodiment of the invention.

FIG. 9 is a sectional diagram showing main parts of the apparatus for resin-encapsulating according to the fourth embodiment. This embodiment is configured to have the same structures as in the first embodiment to exhaust the cavities to decompress through the exhaust vent and to inject the liquid resin under pressure into the cavities through the resin passage from the gate. Therefore, such structures are not shown as a drawing.

The metal mold 8 has the upper mold 10 and the lower mold 11 disposed to oppose each other. These mold blocks form a plurality of cavities 9 for accommodating the flip-chip bonded body 15 as the object to be encapsulated. The upper mold 10 has a first elastic layer 36 such as fluorine-contained rubber formed on a region which comes in contact with the wiring substrate 13 of the flip-chip bonded body 15 in the upper mold 10. The first elastic layer 36 is in close contact with the wiring substrate 13 when the molding die is clamped to prevent the liquid resin from leaking from the cavities 9.

The upper mold 10 and the lower mold 11 are held by the first holder 33 and the second holder 34 respectively. The pressure-reducing seal 16 made of fluorine-contained rubber or the like is disposed along the peripheral edges of the contact faces of the first holder 33 and the second holder 34. The first and the second holders 33, 34 each may hold a plurality of mold blocks collectively. Besides, a second elastic layer 37 is disposed on the top face of the upper mold 10 so to contact to the first holder 33. The second elastic layer 37 serves to uniformly contact the upper molds 10, so to correct inclination of the upper mold 10 when clamping and to remedy variations in forces applied to the wiring substrates 13 set in the plurality of cavities 9. It is a layer of a rubber-like elastic body or a spring having a modulus of elasticity of 250 to 2,100,000 Kgf/cm$^2$. The projection 35 is also formed at the midway between the cavities 9 of the lower mold 11 to receive a load and also to serve as a stopper to adjust a depth of each cavity 9.

In the fourth embodiment, the flip-chip bonded body 15 is set in the lower mold 11 of the metal mold 8. The liquid resin stocked in a syringe is supplied in an appropriate amount to the pot through a dispense nozzle. Before clamping the upper mold 10 and the lower mold 11, the cavities 9 are exhausted and decompressed by a vacuum pump through the exhaust vent and held under high vacuum of 10 Torr or below. The liquid resin stored in the pot is extruded from the pot by the plunger to inject under pressure into the cavities 9 from the gate through the runner. A pressure in a range of 1 to 20 MPa is continuously applied to the liquid resin by the plunger until voids are removed from the liquid resin charged into the cavities 9. The application of pressure is stopped after confirming that the molding resin is also filled uniformly into the gap between the wiring substrate 13 and the semiconductor chip 12 of the flip-chip bonded body 15. The molding resin filled into the cavities 9 is cured and hardened, then an excess portion of the molding resin adhered to a resin-encapsulating layer is removed.

Thus, the liquid resin is uniformly filled among the bumps 14 between the wiring substrate 13 and the semiconductor chip 12 in a short time to produce the uniform resin-encapsulating layer with good characteristics. Since the first elastic layer 36 is formed on the region of the upper mold 10 which comes in contact with the wiring substrate 13 in the metal mold 8 of this embodiment, the liquid resin is prevented from leaking from the cavities 9 to unnecessarily adhere to the wiring substrate 13. Furthermore, since the second elastic layer 37 is disposed on the top face of the upper mold 10 so to contact to the first holder 33, the upper mold 10 is prevented from inclining so to uniformly come in contact with the wiring substrate 13 when clamping the molding die. As a result, a thin flip-chip bonded semiconductor device with good performances, which has the top of the semiconductor chip 12 not covered with the resin-encapsulating layer 24, can be manufactured as shown in FIGS. 4A and 4B.

Embodiment 5

The apparatus for resin-encapsulating and the method for manufacturing a semiconductor device according to a fifth embodiment will be described with reference to FIGS. 10A and 10B.

Figure 10A:
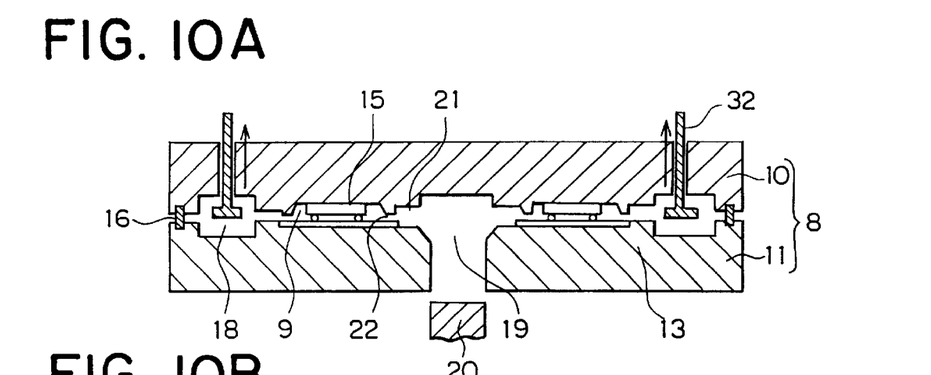
FIG. 10A is a sectional diagram showing main parts of the apparatus for resin-encapsulating according to the fifth embodiment of the invention.
Figure 10B:
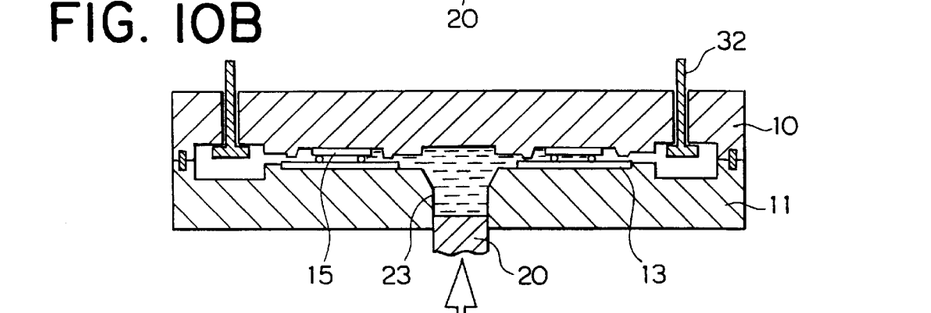
FIG. 10B is a sectional diagram showing main parts of the apparatus for resin-encapsulating for illustrating a method for manufacturing the semiconductor device according to the fifth embodiment.

The apparatus for resin-encapsulating of the fifth embodiment has the metal mold 8 which has the upper mold 10 and the lower mold 11 disposed to oppose each other as shown in FIG. 10A. Two mold blocks of the upper and lower molds 10, 11 form a plurality of cavities 9 for accommodating the flip-chip bonded body 15 as the object to be encapsulated. The pressure-reducing seal 16 made of fluorine-contained rubber or the like is disposed along the peripheral edges of the contact faces of the upper mold 10 and the lower mold 11. The exhaust vent 17 is formed on the upper mold 10 and close to each of the cavities 9. The exhaust valve 32 is disposed in the exhaust vents 17. The individual exhaust vent 17 has at its bottom a non-contact area 18 having a depth sufficient to prevent a pertinent face of the upper mold 10 from contacting to the wiring substrate 13 of the flip-chip bonded body 15 when clamping the molding die. The lower mold 11 has the pot 19 which stored a liquid resin such as an epoxy resin. The pot 19 has a plunger 20 to reciprocate freely therein. Each resin passage comprising the runner 21 and the gate 22 is formed from the pot 19 to the cavities 9. A vacuum pump (not shown) is connected to the exhaust vent 17. And, a heating plate (not shown) is disposed under the metal mold 8 as means for heating it.

In the fifth embodiment, the flip-chip bonded body 15 having the semiconductor 12 connected to the wiring substrate 13 through the bumps 14 is set in position in the lower mold 11, and the liquid resin stocked in a syringe (not shown) is supplied in an appropriate amount to the pot 19 through a dispense nozzle (not shown) as shown in FIG. 10A. Before clamping the upper mold 10 and the lower mold 11 completely, the cavities 9 are exhausted to a reduced pressure by the vacuum pump with the exhaust vent 17 open to keep under high vacuum of 10 Torr or below. As shown in FIG. 10B, the exhaust valve 32 is pushed upward to close the exhaust vent 17, the liquid resin stored in the gate 19 is extruded from the pot 19 by the plunger 20 to inject under pressure into the cavities 9 from the gate 22 through the runner 21.

A pressure in a range of 1 to 20 MPa is continuously applied to the liquid resin 23 by the plunger 20 until voids are removed from the liquid resin 23 charged into the cavities 9. The application of pressure is stopped after confirming that the molding resin is also filled uniformly into the gap between the wiring substrate 13 and the semiconductor chip 12 of the flip-chip bonded body 15. The molding resin filled into the cavities 9 is cured and hardened, then an excess portion of the molding resin adhered to a resin-encapsulating layer is removed.

Thus, the liquid resin 23 is uniformly filled among the bumps 14 between the wiring substrate 13 and the semiconductor chip 12 in a short time to produce the uniform resin-encapsulating layer with good characteristics in a short time. As a result, a thin flip-chip bonded semiconductor device with good performances, which has the top surface of the semiconductor chip 12 not coated with the resin-encapsulating layer 24, can be manufactured as shown in FIGS. 4A and 4B.

Embodiment 6

Figure 11A:
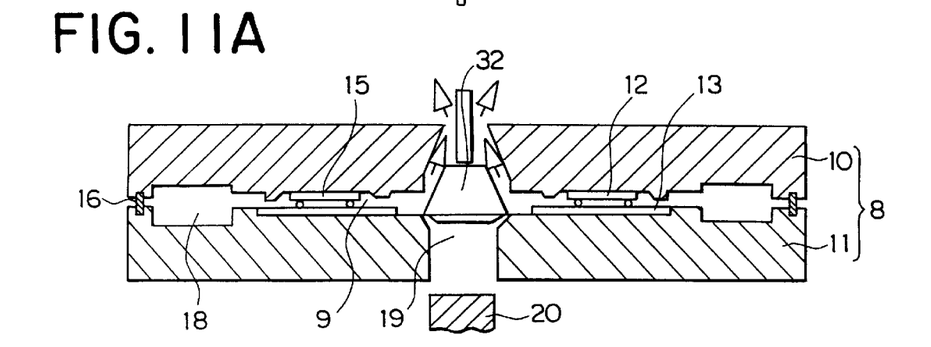
FIG. 11A is a sectional diagram showing main parts of the apparatus for resin-encapsulating according to the sixth embodiment of the invention.
Figure 11B:
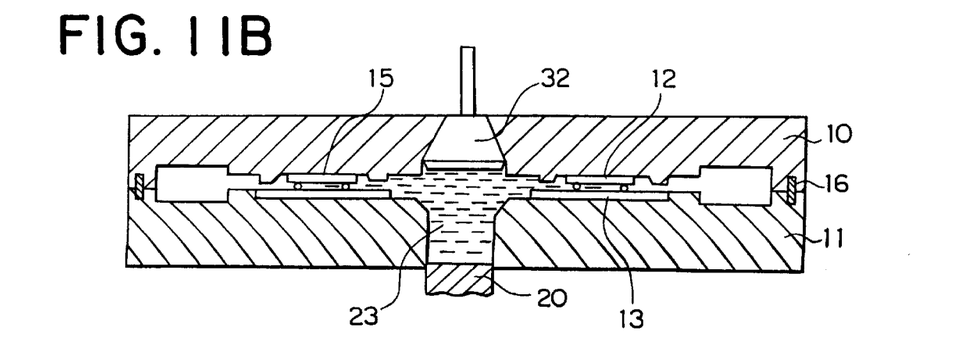
FIG. 11B is a sectional diagram showing main parts of the apparatus for resin-encapsulating for illustrating a method for manufacturing the semiconductor device according to the sixth embodiment.

Referring to FIGS. 11A and 11B, the apparatus for resin-encapsulating and the method for manufacturing a semiconductor device according to a six embodiment will be described.

The apparatus for resin-encapsulating of the sixth embodiment has the metal mold 8 which has the upper mold 10 and the lower mold 11 disposed to oppose each other as shown in FIG. 11A. Two mold blocks of the upper and lower molds, 11 form a plurality of cavities 9 for accommodating the flip-chip bonded body 15 as the object to be encapsulated. The pressure-reducing seal 16 made of fluorine-contained rubber or the like is disposed along the peripheral edges of the contact faces of the upper mold 10 and the lower mold 11. The exhaust vent 17 is formed on the upper mold 10 at the midway of the plurality of cavities 9 and also close to them. The exhaust valve 32 is disposed in the exhaust vent 17. In the neighborhood of the cavities 9 of the lower mold 11, the non-contact area 18 is formed to have a depth sufficient to prevent the pertinent face of the upper mold 10 from coming in contact with the wiring substrate 13 of the flip-chip bonded body 15 when clamping the molding die. The lower mold 11 has the pot 19 which stores a liquid resin such as an epoxy resin. The pot 19 has the plunger 20 to reciprocate freely therein. Each resin passage comprising the runner 21 and the gate 22 is formed from the pot 19 to the cavities 9. A vacuum pump (not shown) is connected to the exhaust vent 17. And, a heating plate (not shown) is disposed under the metal mold 8 as means for heating it.

In the sixth embodiment, the flip-chip bonded body 15 having the semiconductor 12 connected to the wiring substrate 13 through the bumps 14 is set in position in the lower mold 11, and the liquid resin stocked in a syringe (not shown) is supplied in an appropriate amount to the pot 19 through a dispense nozzle (not shown) as shown in FIG. 11A. Before clamping the upper mold 10 and the lower mold 11 completely, the cavities 9 are exhausted to a reduced pressure by the vacuum pump with the exhaust vent 17 open by pushing down the exhaust valve 32 to keep under high vacuum of 10 Torr or below. As shown in FIG. 11B, the liquid resin 23 stored in the gate 19 is extruded from the pot 19 by the plunger 20. The exhaust valve 32 is pushed upward by the extruded liquid resin 23 to close the exhaust vent 17 by the exhaust valve 32. At the same time, the resin passages are opened, and the liquid resin 23 is injected under pressure into the cavities 9 from the gate 22 through the runner 21.

A pressure in a range of 1 to 20 MPa is continuously applied to the liquid resin 23 by the plunger 20 until voids are removed from the liquid resin 23 charged into the cavities 9. The application of pressure is stopped after confirming that the molding resin is also filled uniformly into the gap between the wiring substrate 13 and the semiconductor chip 12 of the flip-chip bonded body 15. The molding resin filled into the cavities 9 is cured and hardened, then an excess portion of the molding resin adhered to a resin-encapsulating layer is removed.

Thus, the liquid resin 23 is uniformly filled among the bumps 14 between the wiring substrate 13 and the semiconductor chip 12 in a short time to produce the uniform resin-encapsulating layer with good characteristics in a short time. As a result, a thin flip-chip bonded semiconductor device with good performances, which has the top surface of the semiconductor chip 12 not coated with the resin-encapsulating layer 24, can be manufactured as shown in FIGS. 4A and 4B.

Figure 12A:
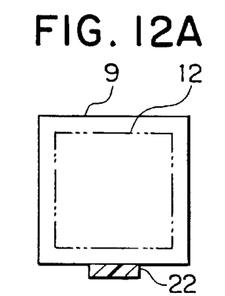
FIG. 12A, FIG. 12B, FIG. 12C, FIG. 12D, FIG. 12E, FIG. 12F, FIG. 12G, FIG. 12H, FIG. 12I, FIG. 12J, FIG. 12K, FIG. 12L, FIG. 12M, FIG. 12N, FIG. 12O, FIG. 12P, FIG. 12Q, FIG. 12R, FIG. 12S, and FIG. 12T are plan diagrams showing the positional relations between a cavity and a gate of a metal mold in the respective embodiments of the invention.
Figure 12B:
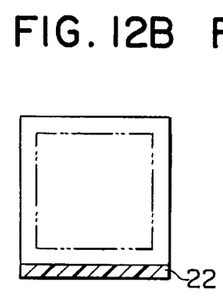
Figures 12C, 12D:
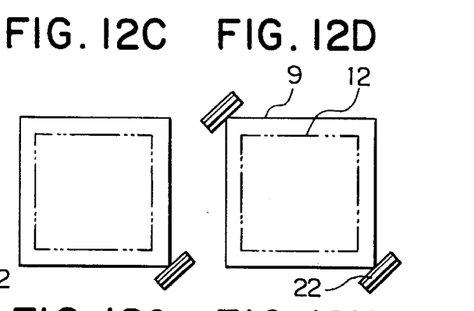
Figure 12E:
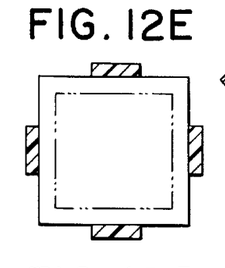
Figures 12F, 12G, 12H:
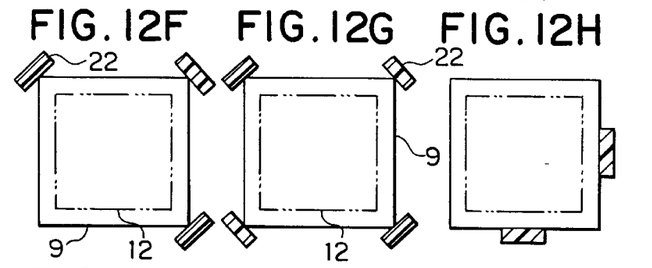
Figure 12I:
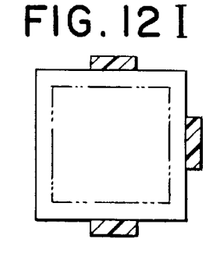
Figure 12J:
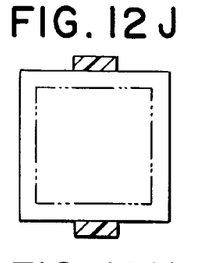
Figure 12K:
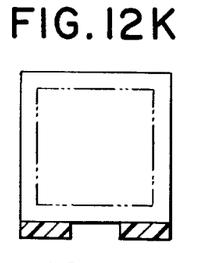
Figure 12L:
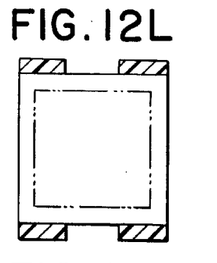
Figure 12M:
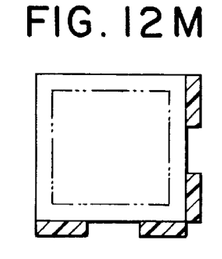
Figure 12N:
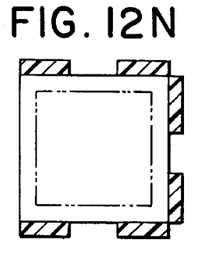
Figure 12O:
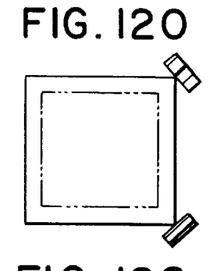
Figure 12P:
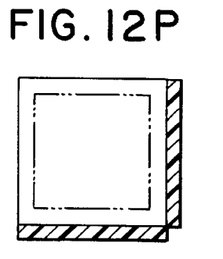
Figure 12Q:
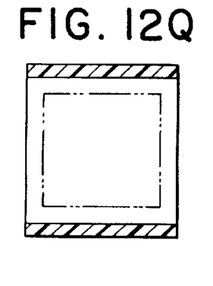
Figure 12R:
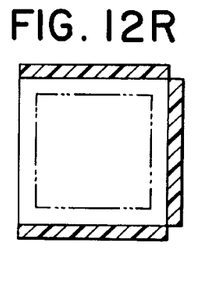

In the embodiments described above, the gates 22 as an inlet for injecting the molding resin into the cavities 9 are not restricted to have particular size (width), quantity and positions because the flip-chip bonded body 15 placed in the cavities 9 of the metal mold 8 does not have any projection to extend outward like a lead frame. Namely, as shown in FIG. 12A to FIG. 12R, the gate 22 in any size (width) and quantity can be disposed at any position around the cavity 9.

Figure 12S:
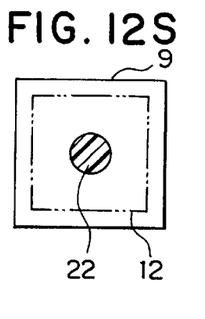
Figure 12T:
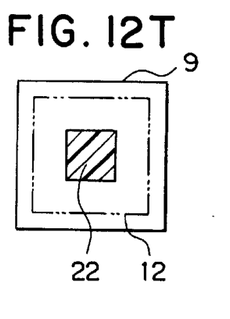

Particularly, when the gate 22 is formed to have the same length as and along one side of the cavity 9, the liquid resin can be injected more uniformly. To prevent the molding resin from remaining on the wiring substrate after molding, the gate 22 may be formed just above the cavity 9 and close to the top face of the flip-chip bonded body as shown in FIG. 12S and FIG. 12T. A total length of all the gates 22 is preferably 5 to 95% of the total length around the semiconductor chip 12.

Figures 13A, 13B:
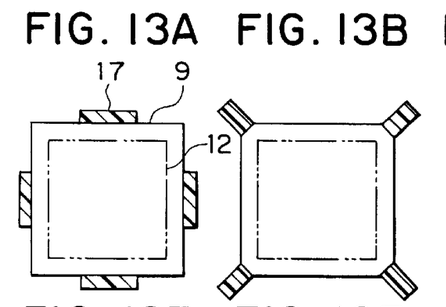
Figure 13C:
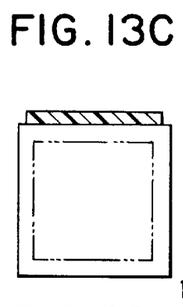
Figure 13D:
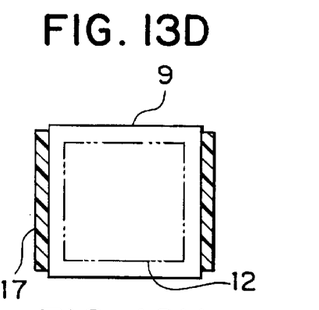
Figure 13E:
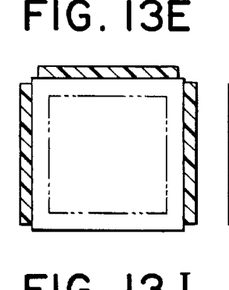
Figures 13F, 13G:
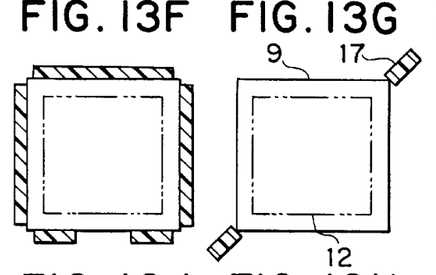
Figure 13H:
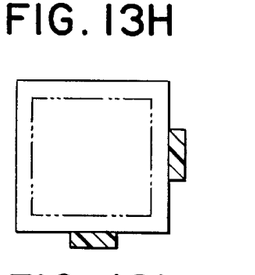
Figure 13I:
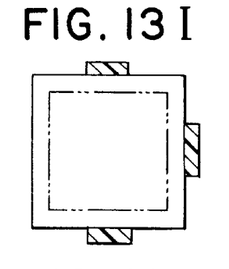
Figure 13J:
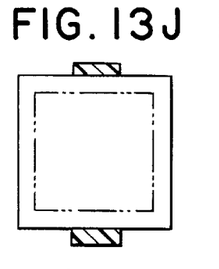
Figure 13K:
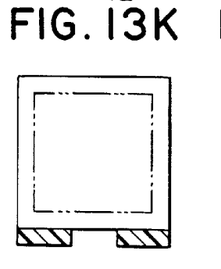
Figure 13L:
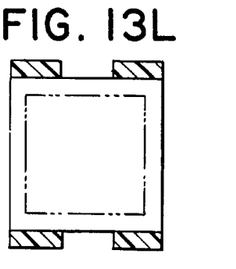
Figure 13M:
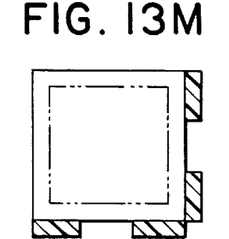
Figure 13N:
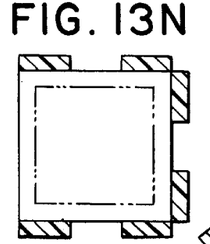

In the embodiments, the exhaust vent 17 is not limited to any particular size (width), quantity and position if it is possible to exhaust the cavities 9 to a reduced pressure by the vacuum pump through the exhaust vent 17. The exhaust vent 17 having any size (width) and quantity can be formed at any position around the cavity 9 as shown in FIG. 13A to FIG. 13Q. The exhaust vent 17 is preferably opened with respect to the cavity 9 excepting positions just above and below the gate 22 in such a way that all the portions in the cavity 9 can be decompressed uniformly.

Figure 14:
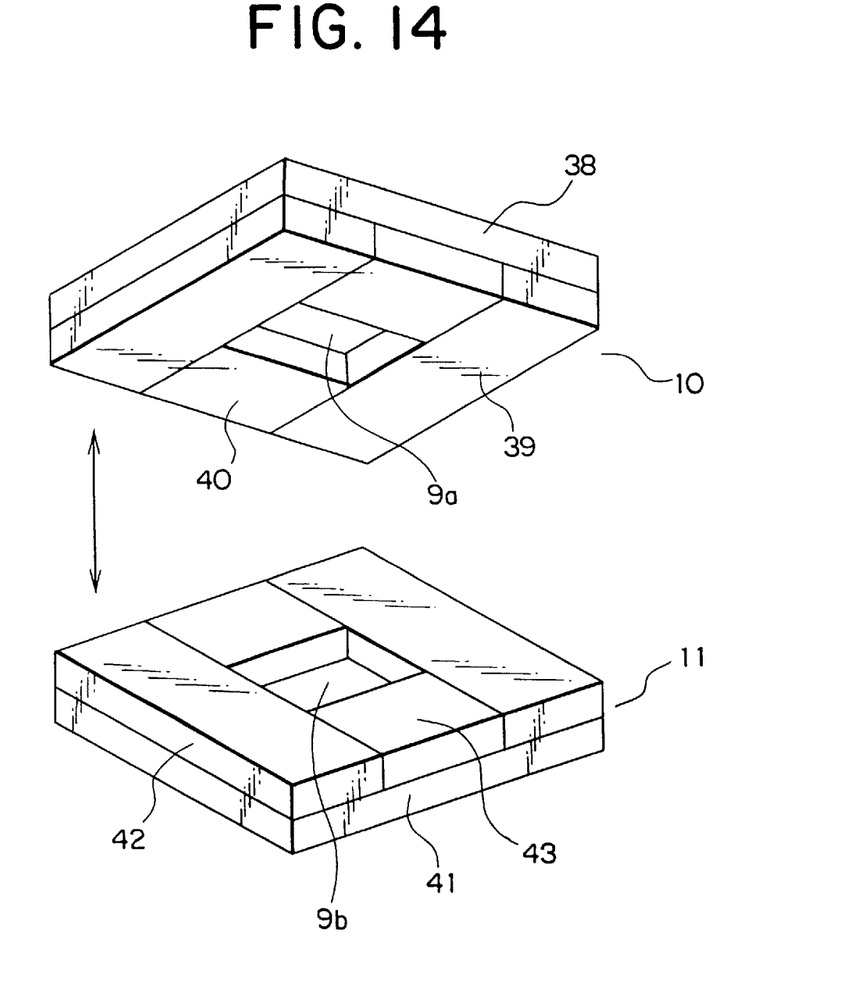
FIG. 14 is a perspective diagram showing an example of upper and lower molds which are formed of a plurality of mold plates in the metal mold for the apparatus for resin-encapsulating according to the invention.

The present invention is not limited to the embodiments described above and can be applied to a variety of methods for manufacturing a flip-chip bonded semiconductor device and various apparatuses for resin-encapsulating to provide the same effects. Namely, the upper mold 10 and the lower mold 11 of the metal mold 8 can be formed of a plurality of mold plates as shown in FIG. 14. In FIG. 14, reference numeral 38 is an upper mold base-plate, 39 is an upper mold longer side-plate, and 40 is an upper mold shorter side-plate. Two upper mold longer side-plates 39 and two upper mold shorter side-plates 40 are combined, and the upper mold base-plate 38 is put on the combined plates 39, 40 to form the upper mold 10 having a cavity (upper mold cavity 9*a*) at the center thereof. Reference numeral 41 is a lower mold base-plate, 42 is a lower mold longer side-plate, and 43 is a lower mold shorter side-plate. Two lower mold longer side-plates 42 and two lower mold shorter side-plates 43 are combined, and a lower mold base-plate 41 is disposed under the combined plates 42, 43 to form a lower mold 11 having a cavity (lower mold cavity 9*b*) at the center thereof.

Figure 15:
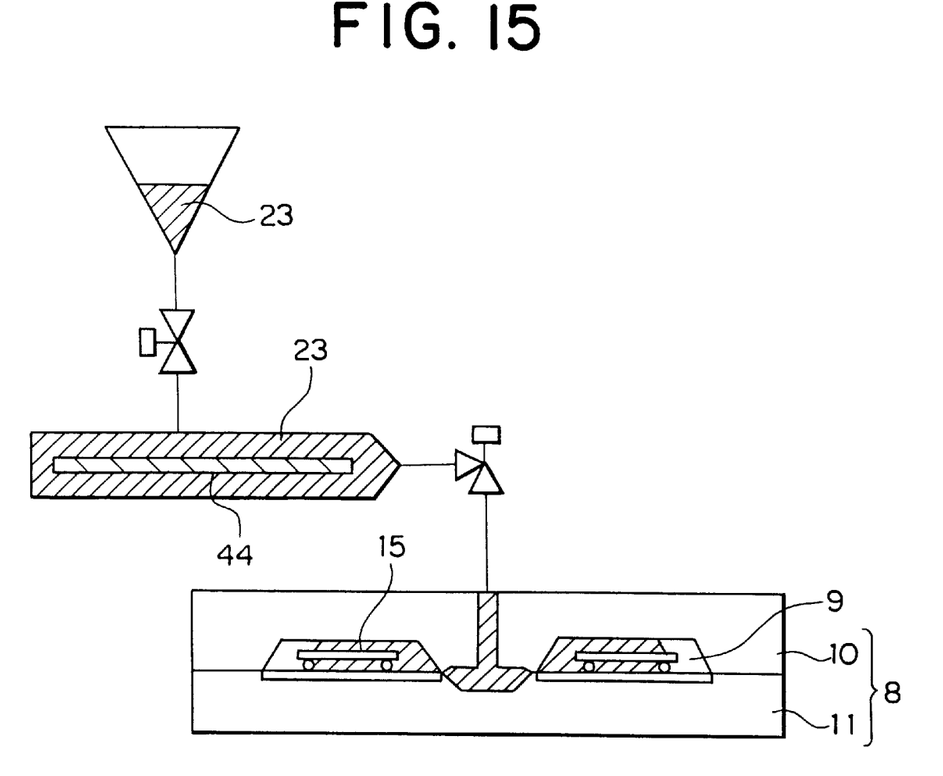
FIG. 15 is a schematic diagram showing another means for filling the liquid resin under pressure into the cavity of the metal mold in the method for manufacturing the semiconductor device of the invention.

In the first to sixth embodiments, the method for injecting under pressure by the plunger 20 was employed as means for injecting the liquid resin 23 under pressure into the cavities 9. A method for injecting the liquid resin 23 under pressure by a screw 44 into the cavities 9 can also be employed as shown in FIG. 15.

As described above, the method for manufacturing a semiconductor device according to the present invention can uniformly fill the liquid resin into the gap between the wiring substrate and the semiconductor chip in the flip-chip bonding with it in a short time to manufacture the semiconductor device having the resin-encapsulating layer with good characteristics in a short time.

In addition, the apparatus for resin-encapsulating according to the invention can uniformly fill the liquid resin into the gap between the wiring substrate and the semiconductor chip in the flip-chip bonding with it in a short time to readily produce the uniform resin-encapsulating layer.

What is claimed is:

1. A method for manufacturing a semiconductor device, comprising:

a step for setting a flip-chip bonded body, which has at least one semiconductor element electrically connected to a wiring substrate through bumps, in a cavity of a molding die formed of a plurality of mold bodies;

a step for enclosing and sealing the cavity except for at an exhaust vent;

a step for exhausting the cavity though the exhaust vent to have a required reduced pressure; and a step for injecting a liquid molding resin at room temperature under pressure into the cavity of the molding die having the flip-chip bonded body therein to form a resin-encapsulating layer between the semiconductor element and the wiring substrate.

2. The method for manufacturing a semiconductor device according to claim 1, further comprising:

a step for heating the molding die before injecting the molding resin under pressure into the cavity of the molding die, and a step for decompressing the cavity of the molding die heated in the heating step.

* * * * *